United States Patent [19]
Saunders et al.

[11] Patent Number: 6,005,381
[45] Date of Patent: *Dec. 21, 1999

[54] ELECTRICAL SIGNAL PHASE DETECTOR

[75] Inventors: John M. Saunders, Mequon; Jeffrey C. Nelson, DePere, both of Wis.

[73] Assignee: Kohler Co., Kohler, Wis.

[*] Notice: This patent is subject to a terminal disclaimer.

[21] Appl. No.: 08/955,080

[22] Filed: Oct. 21, 1997

[51] Int. Cl.⁶ .............................. G01R 23/02; H03K 9/06
[52] U.S. Cl. .................................... 324/76.39; 324/76.48; 324/76.62; 327/39; 327/48
[58] Field of Search ............................ 324/76.39, 76.52, 324/76.55, 76.62, 76.64, 76.77, 76.82, 76.48; 327/39–41, 43, 44, 46–49, 113, 115, 116; 377/44, 47

[56] References Cited

U.S. PATENT DOCUMENTS

| | | | |
|---|---|---|---|
| 3,416,080 | 12/1968 | Wright et al. | 324/76.62 |
| 3,491,294 | 1/1970 | Little et al. | 324/76.62 |
| 3,524,131 | 8/1970 | McWaid | 324/76.64 |
| 3,727,079 | 4/1973 | Garrett | 327/79 |
| 3,745,475 | 7/1973 | Turner | 324/76.48 |
| 3,859,512 | 1/1975 | Ritzinger | 324/76.48 |
| 3,906,361 | 9/1975 | Nessler et al. | 324/76.82 |
| 4,070,618 | 1/1978 | Thomas | 324/76.48 |
| 4,345,169 | 8/1982 | Saleh | 327/72 |
| 4,352,999 | 10/1982 | Galpin | 327/79 |
| 4,480,220 | 10/1984 | Tan et al. | 324/71.3 |
| 5,896,049 | 4/1999 | Aunders et al. | 327/48 |

*Primary Examiner*—Diep N. Do
*Attorney, Agent, or Firm*—Quarles & Brady LLP

[57] ABSTRACT

A circuit for detecting a predefined reoccurring phase point an periodic electrical signal has an input stage which rectifies the signal into first and second complementary signals. A Schmitt circuit has an input connected to the rectifier stage and produces a first intermediate signal in response to the voltage of the first complementary signal. A complementary Schmitt circuit is connected to the rectifier stage and produces a second intermediate signal in response to the voltage of the second complementary signal. An output stage that is connected to the Schmitt circuit and the complementary Schmitt circuit, responds to the first and second intermediate signals by producing an indication of each occurrence of the reoccurring phase point in the periodic electrical signal.

9 Claims, 4 Drawing Sheets

ELECTRICAL SIGNAL PHASE DETECTOR

BACKGROUND OF THE INVENTION

The present invention relates to electrical circuits which detect a predefined reoccurring characteristic or point in the waveform of a periodic signal; and particularly to such circuits which detect zero crossings of the periodic signal, and more particularly to only the zero crossing at the beginning of each signal cycle.

It often is desirable to be able to detect a given reoccurring characteristic, such as a maximum, minimum or zero crossing point, of a time periodic electrical signal. For example, a sinusoidal signal has two zero crossings per cycle, i.e. one crossing at the beginning of the cycle and another at the mid point of the cycle; of course there is another zero crossing at the end of the cycle when another signal cycle begins. Detecting one zero crossing per cycle can be employed to determine the frequency or the period of the signal. It also is beneficial to detect the occurrence of corresponding characteristics in two different signals in order to determine the phase relationship of those signals.

Circuits have been developed to detect zero crossings of a signal. However, such prior circuits detected every zero crossing and could not distinguish the zero crossing at the beginning of a cycle from the one at the cycle mid point.

SUMMARY OF THE INVENTION

A general object of the present invention is to provide an electrical circuit which detects a predefined characteristic which reoccurs in the waveform of a periodic signal.

Another object is to provide such a circuit in which the reoccurring characteristic of the signal can be defined by proper selection of values for and interconnection of components of the circuit.

A further object of the present invention is to provide a detection circuit that is able to distinguish the zero crossing at either the beginning or mid point of a signal cycle from the other zero crossing of the cycle.

These and other objects are satisfied by a circuit which comprises a rectifier stage that produces first and second complementary signals from a periodic input signal. A Schmitt circuit has an input which is coupled to the rectifier stage and produces a first intermediate signal in response to voltage variation of the first complementary signal. A complementary Schmitt circuit has an input connected to the rectifier stage and produces a second intermediate signal in response to the voltage level of the second complementary signal.

The Schmitt circuit is characterized by a voltage hysteresis transfer function which produces one of two discreet output voltages, e.g. circuit ground potential or Vcc, depending upon the relationship of the input voltage to lower and upper thresholds. As the input voltage increases from ground potential, the output voltage remains at ground potential as long as the input voltage is below the upper threshold. When the input voltage exceeds the upper threshold, the output voltage switches to Vcc. Thereafter the output voltage remains at Vcc until the input voltage falls below the lower threshold at which time the output voltage returns to ground potential.

The complementary Schmitt circuit functions whereby the output voltage remains at ground potential until the increasing input voltage level reaches the lower threshold when the output voltage switches to Vcc. Thereafter, the output voltage remains at Vcc until the input voltage level first exceeds and then decreases below the upper threshold at which occasion the output voltage returns to ground potential.

An output stage is connected to the Schmitt circuit and to the complementary Schmitt circuit to receive the first and second intermediate signals. The output stage responds to the relationship of the first and second intermediate signals by producing an output signal that indicates each occurrence of the reoccurring phase point in the periodic input signal.

In the preferred embodiment, the Schmitt circuit includes a first comparator for comparing the first complementary signal to a first reference voltage, and an output at which a voltage level is produced in response to that comparison. A first flip-flop has a clock input connected to the output of the first comparator, and has an output at which the first intermediate signal is produced.

The preferred complementary Schmitt circuit comprises a second comparator which compares the second complementary signal to a second reference voltage and produces a voltage level in response to that comparison. A third comparator compares the second complementary signal to a third reference voltage and produces another voltage level in response to comparing the second complementary signal. A second flip-flop having a clock input connected to the first output of the first comparator, and a reset input connected to the second output of the second comparator. One output of the second flip-flip is connected to a reset input of the first flip-flip and the second intermediate signal is produced at another output.

In the preferred embodiment the output stage comprises an output flip-flop with a reset input connected to the Schmitt circuit to receive the first intermediate signal and a clock input connected to the complementary Schmitt circuit to receive the second intermediate signal. This latter flip-flop produces the output signal that indicates each occurrence of the reoccurring phase point in the periodic input signal.

DETAILED DESCRIPTION OF THE INVENTION

Figure 1:
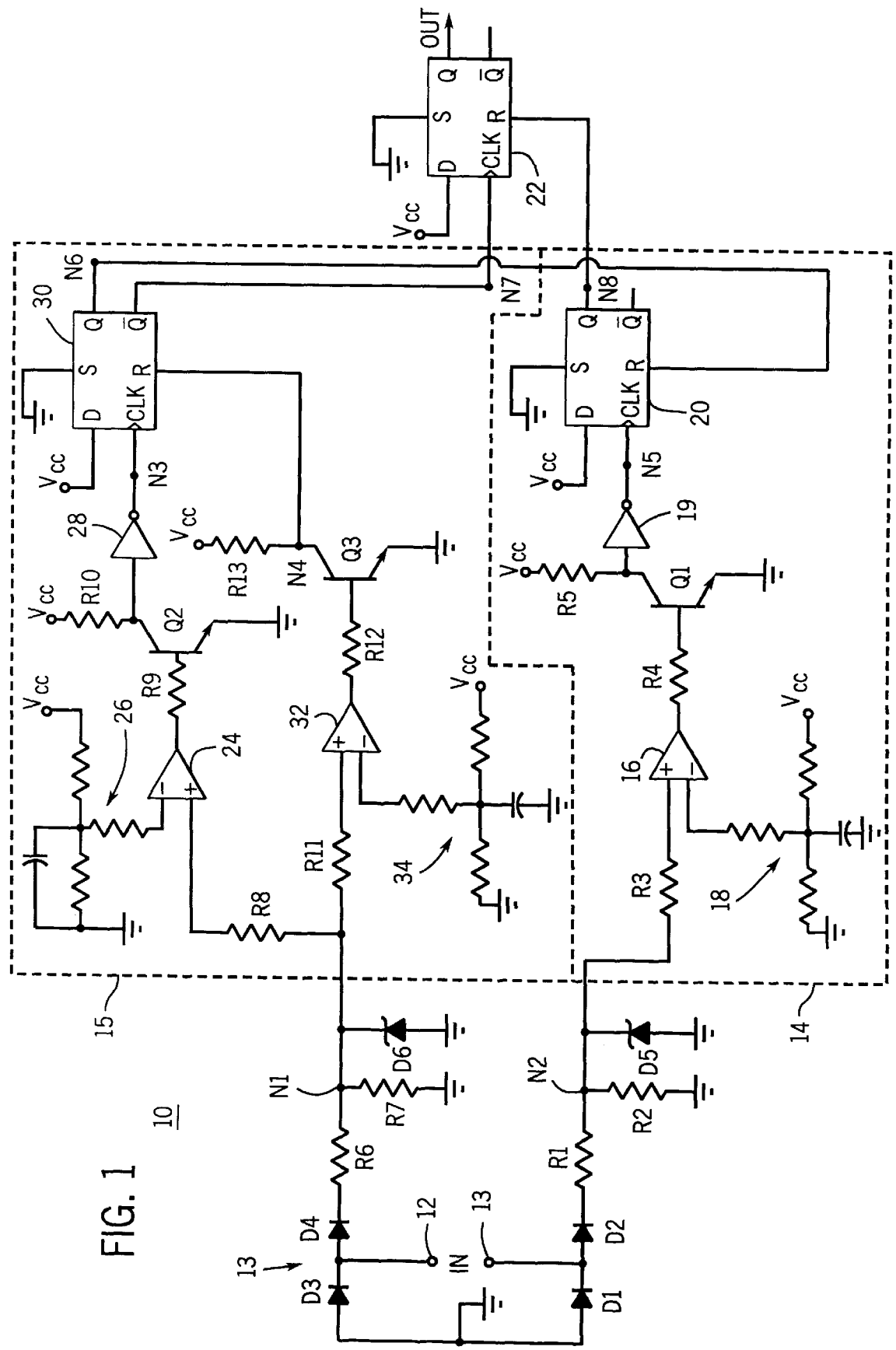
FIG. 1 is a schematic circuit diagram of a signal phase detector according to the present invention.

With initial reference to FIG. 1, a phase detector, generally designated 10, has a pair of input terminals 11 and 12 across which is applied an electrical signal for processing. Although the phase detector is being described in terms of processing a time periodic electrical signal and detecting a reoccurring characteristic, such as a zero crossing, of that signal, phase detector 10 can be used to detect an occurrence of a predefined characteristic of other types of signals.

Terminals 11 and 12 are part of an input stage 13 which includes a pair of half-wave rectifiers formed by diodes D1–D4 that produce complementary DC signals at nodes N1 and N2. The rectified signals are scaled in attenuator circuits comprising resistors R1 and R2 along with Zener diode D5 for one circuit branch, and resistors R6 and R7 in conjunction with Zener diode D6 for the complementary branch. The attenuation produces signal levels which are compatible with the subsequent digital logic of a Schmitt circuit 14 and a complementary Schmitt circuit 15.

The Schmitt circuit 14 receives the signal from node N2 and applies that signal via resistor R3 to the non-inverting input of a first voltage comparator 16. A first reference voltage, produced by voltage divider 18, is applied to the inverting input of the first voltage comparator 16. The output of the first comparator 16 is applied through resistor R4 to the base of an NPN transistor Q1, which has an emitter connected directly to ground and a collector connected by resistor R5 to a source of positive voltage Vcc.

The collector of transistor Q1 also is connected to the input of an inverter 19 having an output at node N5 that is connected to the CLOCK input of a first D-type flip-flop 20. The D input to flip-flop 20 is tied to the positive voltage Vcc and the SET input is clamped to ground. The Q output of flip-flop 20 is directly connected to the RESET input of a second, or output, D-type flip-flop 22.

Returning to the input stage 13 of the phase detector 10, node N1 is connected to the input of the complementary Schmitt circuit 15. Specifically, resistor R8 couples node N1 to the non-inverting input of a second voltage comparator 24 which has an inverting input that receives a second reference voltage from voltage divider 26. The output of the second voltage comparator 24 is coupled by resistor R9 to the base of transistor Q2 which has an emitter connected directly to ground and a collector connected by resistor R10 to positive voltage Vcc. The collector of transistor Q2 also is connected to the input of a second inverter 28 which produces an output that is coupled at node N3 to the clock input of a third D-type flip-flop 30. The D input of the third flip-flop 30 is directly connected to the positive voltage Vcc, while the SET input is tied to ground. The Q output of the third flip-flop 30 is coupled via node N6 to the RESET input of the first flip-flop 20.

The Q output of the third flip-flop 30, at node N7, is applied to the clock input of the second flip-flop 22. The D input of the second flip-flop 22 is clamped to positive voltage Vcc and the SET input is tied to ground. The Q terminal of the second flip-flop 22 produces the output signal for the phase detector 10, as will be described.

Referring again to the input of the complementary Schmitt circuit 15, node N1 of the input stage 13 also is coupled by resistor R11 to the non-inverting input of a third voltage comparator 32. Voltage divider 34 produces a third reference voltage is applied to the inverting input of the third voltage comparator 32. The output of the third voltage comparator 32 is coupled through resistor R12 to the base of transistor Q3 which has an emitter tied directly to ground and a collector coupled by resistor R13 to supply voltage Vcc. The collector of transistor Q3 also is connected at node N4 to the RESET input of the third flip-flop 30.

Figure 2A:
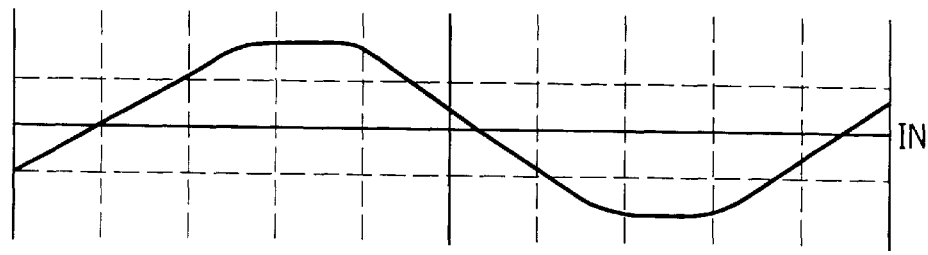
FIGS. 2A through 2J depict waveforms of signals at selected places in the signal phase detector of FIG. 1.
Figure 2B:
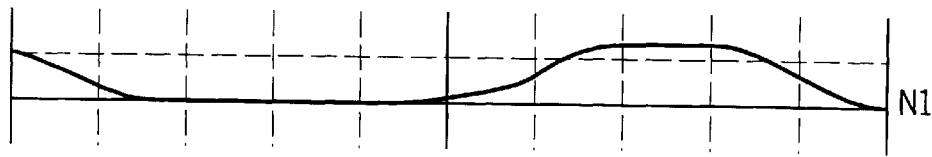
Figure 2C:
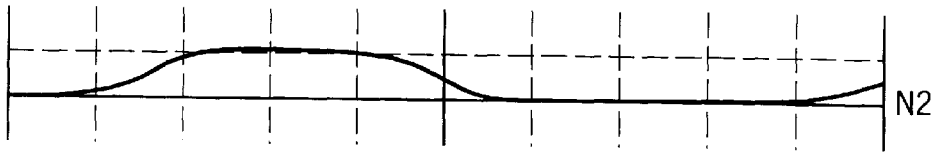

The operation of the phase detector 10 will be described with reference to the circuit diagram in FIG. 1 and the waveform diagrams in FIGS. 2A–2J. Although a sinusoidal input signal is depicted in FIG. 2A, it is understood that the present invention can be utilized with other types of waveforms with a substantially constant first derivative in the region of the zero crossing point. The input signal is applied across terminals 11 and 12 and is partitioned by the pair of half-wave rectifiers, diodes D1–D4, into the two complementary signals at nodes N1 and N2 having the waveforms shown in FIGS. 2B and 2C. The signals at nodes N1 and N2 are applied to complementary Schmitt circuit 15 and the Schmitt circuit 14, respectively.

The Schmitt circuit 14 is characterized by a voltage hysteresis transfer function which produces one of two discreet output voltages, e.g. circuit ground potential or Vcc, depending upon the relationship of the input voltage to lower and upper thresholds. As the input voltage increases from ground potential, the output voltage remains at ground potential as long as the input voltage is below the upper threshold. When the input voltage exceeds the upper threshold, the output voltage switches to Vcc. Thereafter, the output voltage remains at Vcc until the input voltage falls below the lower threshold at which time the output voltage returns to ground potential.

In contrast, the complementary Schmitt circuit 15 operates whereby the output voltage remains at ground potential until the increasing input voltage level reaches the lower threshold when the output voltage switches to Vcc. Thereafter, the output voltage remains at Vcc until the input voltage level first exceeds and then decreases below the upper threshold at which occasion the output voltage returns to ground potential.

Figure 2D:
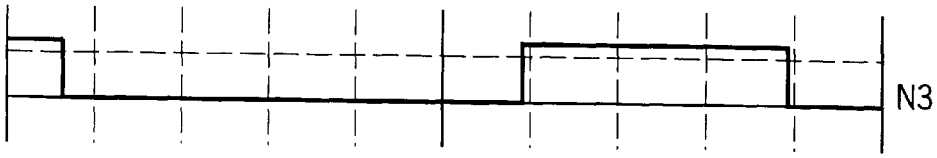
Figure 2E:
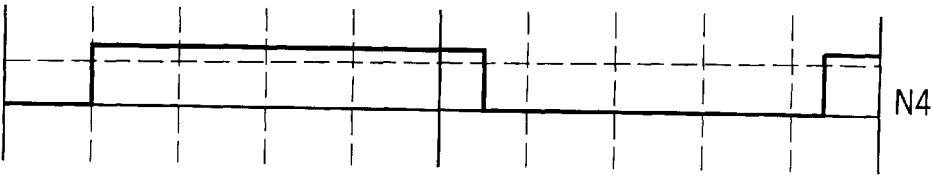
Figure 2F:
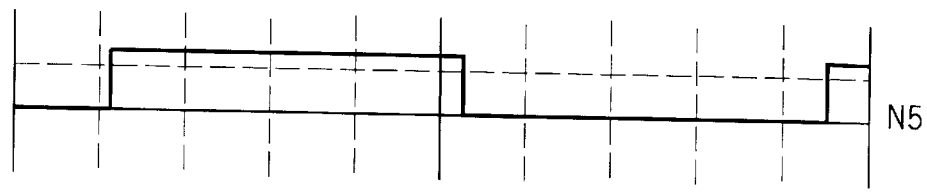
Figure 2G:
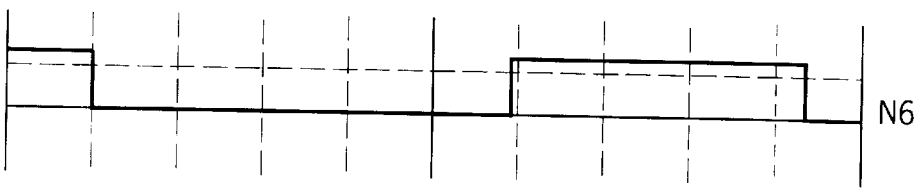
Figure 2H:
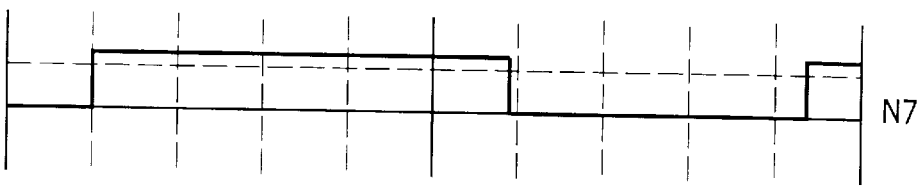
Figure 2I:
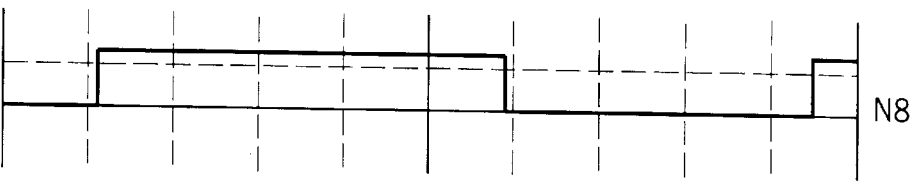
Figure 2J:
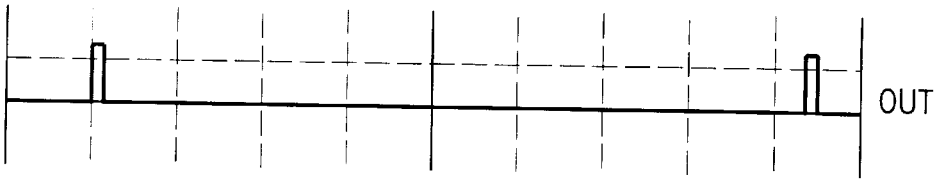

The Schmitt circuit 14 receives the signal at node N2 (FIG. 2C) and comparator 16 determines whether that signal exceeds a reference voltage level set by voltage divider 18. When that occurs the comparator 16 produces a high logic level output which turns on transistor Q1. When Q1 is conductive, the input to inverter 19 is grounded producing a high logic level at node N5 (FIG. 2F) which is applied to the clock input of the first flip-flop 20. The comparator 16 and associated output circuits produce the digital equivalent of the rectified input voltage at node N8. That is, the voltage at node N5 is a high logic level for the duration of the positive half cycle of the input signal applied across terminals 11 and 12. The rising edge of the waveform at node N5 causes the Q output of the first flip-flop 20 to go high as shown in the waveform for node N8 (FIG. 2I). This output signal from the Schmitt circuit 14 resets the second flip-flop 22 causing the output signal for the phase detector 10 to go to a low logic level, as shown in FIG. 2J.

At the same time, the complementary rectified input signal produced at node N1 (FIG. 2B) is applied to the input of the complementary Schmitt circuit 15. That signal is applied to a similar voltage comparator 24 to produce a digital equivalent of the rectified input voltage at node N3, as depicted in FIG. 2D. This digital equivalent is fed to the clock input of the third flip-flop 30. The rising edge of the waveform at node N3 causes the Q output of the third flip-flop 30 (FIG. 2G) to go to a high logic level. The Q output of the third flip-flop 30 at node N6 is connected to the RESET input of the first flip-flop 20 thereby causing the Q output of the first flip-flop at node N8 to go to a low logic level, as shown in FIG. 2I. Simultaneously, the Q output of the third flip-flop 30 as shown in the waveform at node N7 (FIG. 2H) goes low.

The complementary rectified signal at node N1 (FIG. 2B) also is applied to the third voltage comparator 32 within the complementary Schmitt circuit 15. This comparator 32 receives a reference voltage level from voltage divider that is lower than the reference voltage produced by voltage divider 26 and is applied to the second comparator 24 within complementary Schmitt circuit 15. As a consequence, the output of the third comparator 32 will go high before the output of the second comparator 24. The output of the third comparator 32 is inverted by resistor R13 and transistor Q3 to produce a waveform at node N4 as shown in FIG. 2E. This inverted waveform was applied to the RESET input of the third flip-flop 30. As a consequence, when the signal at node N1 falls below the reference voltage threshold produced by voltage divider 34, the voltage level at node N4 goes high resetting the third flip-flop 30. That action produces a low logic level at the Q output of the third flip-flop 30 (node N6) and a high logic level at the $\overline{Q}$ output (node N7).

In response to the signals from the two Schmitt circuits 14 and 15, the second flip-flop 22 produces a positive pulse at its Q terminal (OUT) upon the occurrence of the zero crossing at the beginning (0° phase) of each cycle of the input signal to the phase detector 10. There is no equivalent pulse at the mid cycle (180° phase) zero crossing of the input signal. Note that the 0° phase zero crossing of the input signal occurs at the center of the output signal pulse, thus the output pulse provides an accurately timed indication of the input signal phase.

By reversing the connection of nodes N1 and N2 to the Schmitt circuit 14 and complementary Schmitt circuit 15, the output pulses of the phase detector 10 will indicate the occurrence of a zero crossing at the 180° point of the input signal cycle. In this version of the phase detector, node N1 is connected to the input of the Schmitt circuit 14 and node N2 is connected to the input of the complementary Schmitt circuit 15. The present phase detector also can be configured to produce the output pulses at the maximum or minimum points of the input signal waveform.

Figure 3:
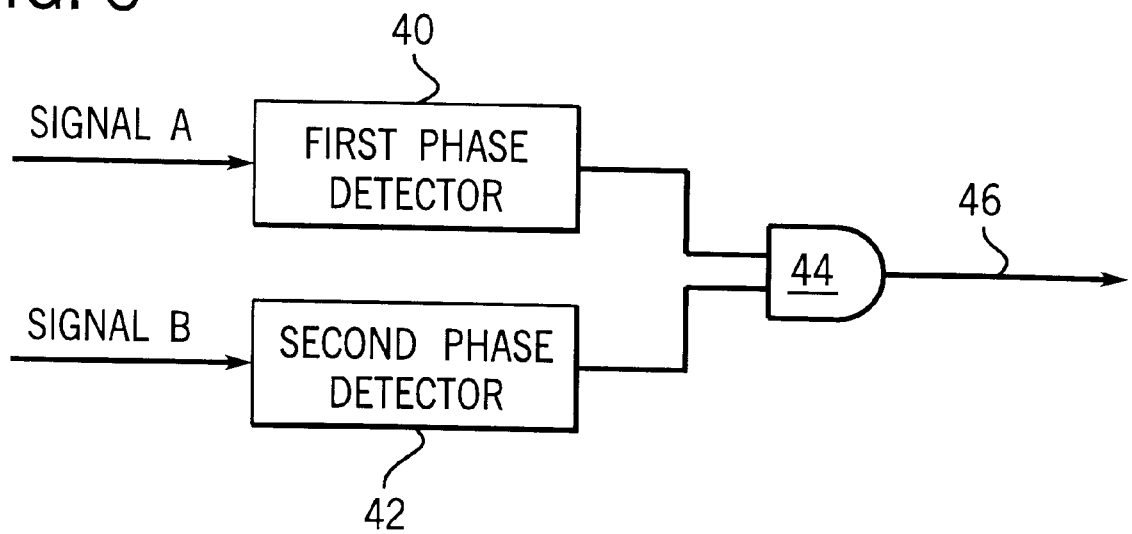
FIG. 3 illustrates the use of the present signal phase detector in a circuit which indicates when two signals are in phase concurrence.

With reference to FIG. 3, the phase detector according to the present invention can be utilized to determine when two signals A and B are in phase. With reference to FIG. 3, SIGNAL A is applied to the input of a first phase detector 40 and SIGNAL B is applied to a second phase detector 42. The two phase detectors produce output pulses, as previously described, when the predefined reoccurring characteristic (e.g. the zero degree phase point) occurs in each signal. The output pulses are applied to different inputs of an AND gate 44. The output of the AND gate 44 on line 46 goes high when the outputs from both the first and second phase detectors 40 and 42 are at high logic levels, as occurs when the predefined characteristic occurs substantially simultaneously in signals A and B.

We claim:

1. A circuit for detecting a predefined characteristic of an electrical signal, said circuit comprising:

a rectifier stage which rectifies the electrical signal into first and second complementary signals;

a Schmitt circuit having an input connected to the rectifier stage, and in response to the first complementary signal, the Schmitt circuit producing a first intermediate signal;

a complementary Schmitt circuit with an input connected to the rectifier stage, and in response to the second complementary signal producing a second intermediate signal; and an output stage connected to the Schmitt circuit and the complementary Schmitt circuit, and responding to the first and second intermediate signals by producing an output signal that indicates each occurrence of the predefined characteristic of the electrical signal.

2. The circuit as recited in claim 1 wherein the Schmitt circuit comprises:

a comparator for comparing the first complementary signal to a first reference voltage and having an output at which a voltage level is produced in response thereto; and a flip-flop having a clock input connected to the output of the comparator, and having an output at which the first intermediate signal is produced.

3. The circuit as recited in claim 1 wherein the complementary Schmitt circuit comprises:

a first comparator for comparing the second complementary signal to a first reference voltage and having a first output at which a voltage level is produced in response to the comparing;

a second comparator for comparing the second complementary signal to a second reference voltage and having a second output at which another voltage level is produced in response to comparing the second complementary signal; and a flip-flop having a clock input connected to the first output of the first comparator, a reset input connected to the second output of the second comparator, and a third output at which the second intermediate signal is produced.

4. The circuit as recited in claim 1 wherein the output stage produces the output signal whenever the first and second intermediate signals have opposite logic levels.

5. The circuit as recited in claim 1 wherein the output stage comprises a flip-flop having a reset input connected to the Schmitt circuit to receive the first intermediate signal, a clock input connected to the complementary Schmitt circuit to receive the second intermediate signal, and an output at which the output signal is produced.

6. A circuit for detecting a predefined reoccurring phase point an periodic electrical signal, said circuit comprising:

a rectifier stage which rectifies the periodic electrical signal into first and second complementary signals;

a Schmitt circuit including a first comparator for comparing the first complementary signal to a first reference voltage and producing a first output voltage in response thereto, and a first flip-flop with a clock input connected to receive the first output voltage from the first comparator, the first flip-flop having a reset input and a first output at which a first intermediate signal is produced;

a complementary Schmitt circuit including a second comparator for comparing the second complementary signal to a second reference voltage and producing a second output voltage in response thereto, a third comparator for comparing the second complementary signal to a third reference voltage and producing a second output voltage in response thereto, and a second flip-flop having a clock input at which the second output voltage is received and a reset input at which the second output voltage is received, the second flip-flop further having a second output at which a second intermediate signal is produced and a third output connected to the reset input of the first flip-flop; and an output stage connected to the first and second outputs and responding to the first and second intermediate signals by producing an output signal that indicates each occurrence of the reoccurring phase point in the periodic electrical signal.

7. The circuit as recited in claim 6 wherein the output stage comprises a flip-flop having a reset input connected to the first output of the Schmitt circuit, a clock input connected to the second output of the complementary Schmitt circuit, and an output terminal at which the output signal is produced.

8. The circuit as recited in claim 6 further comprising an inverter connecting the third output of the third comparator to the reset input of the second flip-flop.

9. The circuit as recited in claim 6 wherein the output stage produces the output signal whenever the first and second intermediate signals have opposite logic levels.

* * * * *